(12) United States Patent
Shue et al.

(10) Patent No.: US 11,848,270 B2
(45) Date of Patent: Dec. 19, 2023

(54) CHIP STRUCTURE AND METHOD FOR FORMING THE SAME

(71) Applicant: Taiwan Semiconductor Manufacturing Co., Ltd., Hsinchu (TW)

(72) Inventors: Hong-Seng Shue, Zhubei (TW); Sheng-Han Tsai, Hsinchu (TW); Kuo-Chin Chang, Chiayi (TW); Mirng-Ji Lii, Sinpu Township, Hsinchu County (TW); Kuo-Ching Hsu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/422,988

(22) Filed: May 25, 2019

(65) Prior Publication Data
US 2020/0058589 A1 Feb. 20, 2020

Related U.S. Application Data

(60) Provisional application No. 62/718,556, filed on Aug. 14, 2018.

(51) Int. Cl.
*H01L 23/528* (2006.01)
*H01L 23/00* (2006.01)
*H01L 23/522* (2006.01)

(52) U.S. Cl.
CPC ...... *H01L 23/5283* (2013.01); *H01L 23/5226* (2013.01); *H01L 24/08* (2013.01); *H01L 24/09* (2013.01); *H01L 24/11* (2013.01); *H01L 24/16* (2013.01); *H01L 24/17* (2013.01); *H01L 2224/023* (2013.01);
(Continued)

(58) Field of Classification Search
CPC ......... H01L 24/13; H01L 24/02; H01L 24/03; H01L 23/3107; H01L 2224/03; H01L 23/522; H01L 23/5226; H01L 24/08; H01L 24/09; H01L 24/16; H01L 2224/0233; H01L 2224/02235; H01L 2224/0224; H01L 2224/02245; H01L 2224/0225; H01L 2224/02255; H01L 2224/023; H01L 2224/0401; H01L 2224/0805;
(Continued)

(56) References Cited

U.S. PATENT DOCUMENTS 6,118,180 A * 9/2000 Loo .................. H01L 24/05
257/737
2003/0133115 A1* 7/2003 Chen ............... G03F 7/70633
356/401

(Continued)

*Primary Examiner* — Marcos D. Pizarro
(74) *Attorney, Agent, or Firm* — McClure, Qualey & Rodack, LLP

(57) ABSTRACT

A chip structure is provided. The chip structure includes a substrate. The chip structure includes a redistribution layer over the substrate. The chip structure includes a bonding pad over the redistribution layer. The chip structure includes a shielding pad over the redistribution layer and surrounding the bonding pad. The chip structure includes an insulating layer over the redistribution layer and the shielding pad. The chip structure includes a bump over the bonding pad and the insulating layer. A sidewall of the bump is over the shielding pad.

20 Claims, 12 Drawing Sheets

(52) U.S. Cl.
CPC ............. *H01L 2224/0224* (2013.01); *H01L 2224/0225* (2013.01); *H01L 2224/0231* (2013.01); *H01L 2224/0233* (2013.01); *H01L 2224/02235* (2013.01); *H01L 2224/02245* (2013.01); *H01L 2224/02255* (2013.01); *H01L 2224/02373* (2013.01); *H01L 2224/02381* (2013.01); *H01L 2224/0401* (2013.01); *H01L 2224/081* (2013.01); *H01L 2224/0805* (2013.01); *H01L 2224/08052* (2013.01); *H01L 2224/08113* (2013.01); *H01L 2224/16104* (2013.01)

(58) Field of Classification Search
CPC ..... H01L 2224/08052; H01L 2224/081; H01L 2224/08113; H01L 2224/16104
See application file for complete search history.

(56) References Cited

U.S. PATENT DOCUMENTS

| | | | | |
|---|---|---|---|---|
| 2014/0167261 | A1* | 6/2014 | Topacio | H01L 24/17 257/737 |
| 2014/0191390 | A1* | 7/2014 | Chuang | H01L 24/05 257/737 |
| 2015/0214170 | A1* | 7/2015 | Chen | H01L 24/13 257/737 |
| 2016/0315067 | A1* | 10/2016 | Chou | H01L 23/3142 |
| 2019/0229079 | A1* | 7/2019 | Pozder | H01L 24/03 |

* cited by examiner

CHIP STRUCTURE AND METHOD FOR FORMING THE SAME

PRIORITY CLAIM AND CROSS-REFERENCE

This application claims the benefit of U.S. Provisional Application No. 62/718,556, filed on Aug. 14, 2018, and entitled "BUMP PAD STRUCTURE", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the chip structure of FIG. 1A, in accordance with some embodiments.

FIG. 1B-1 is a top view of the chip structure of FIG. 1B, in accordance with some embodiments.

FIG. 1C-1 is a top view of the chip structure of FIG. 1C, in accordance with some embodiments.

DETAILED DESCRIPTION

Figure 1A:
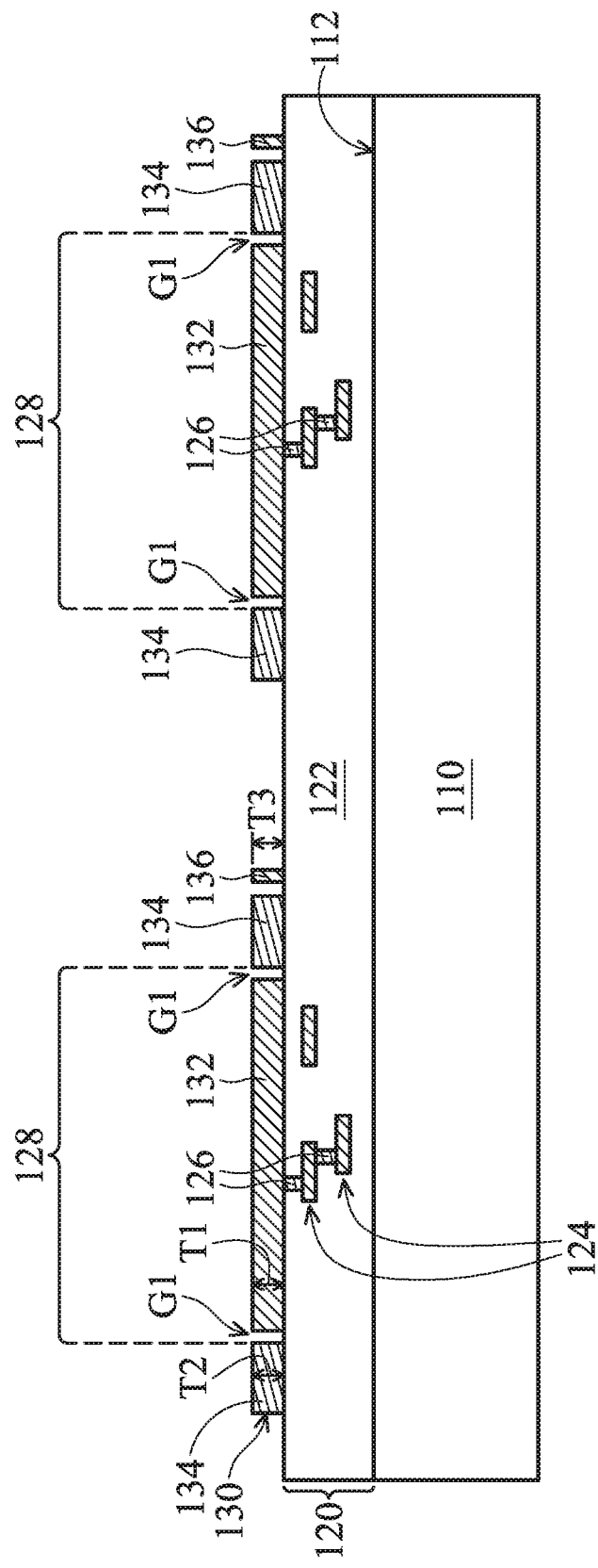
FIGS. 1A-1C are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1A:
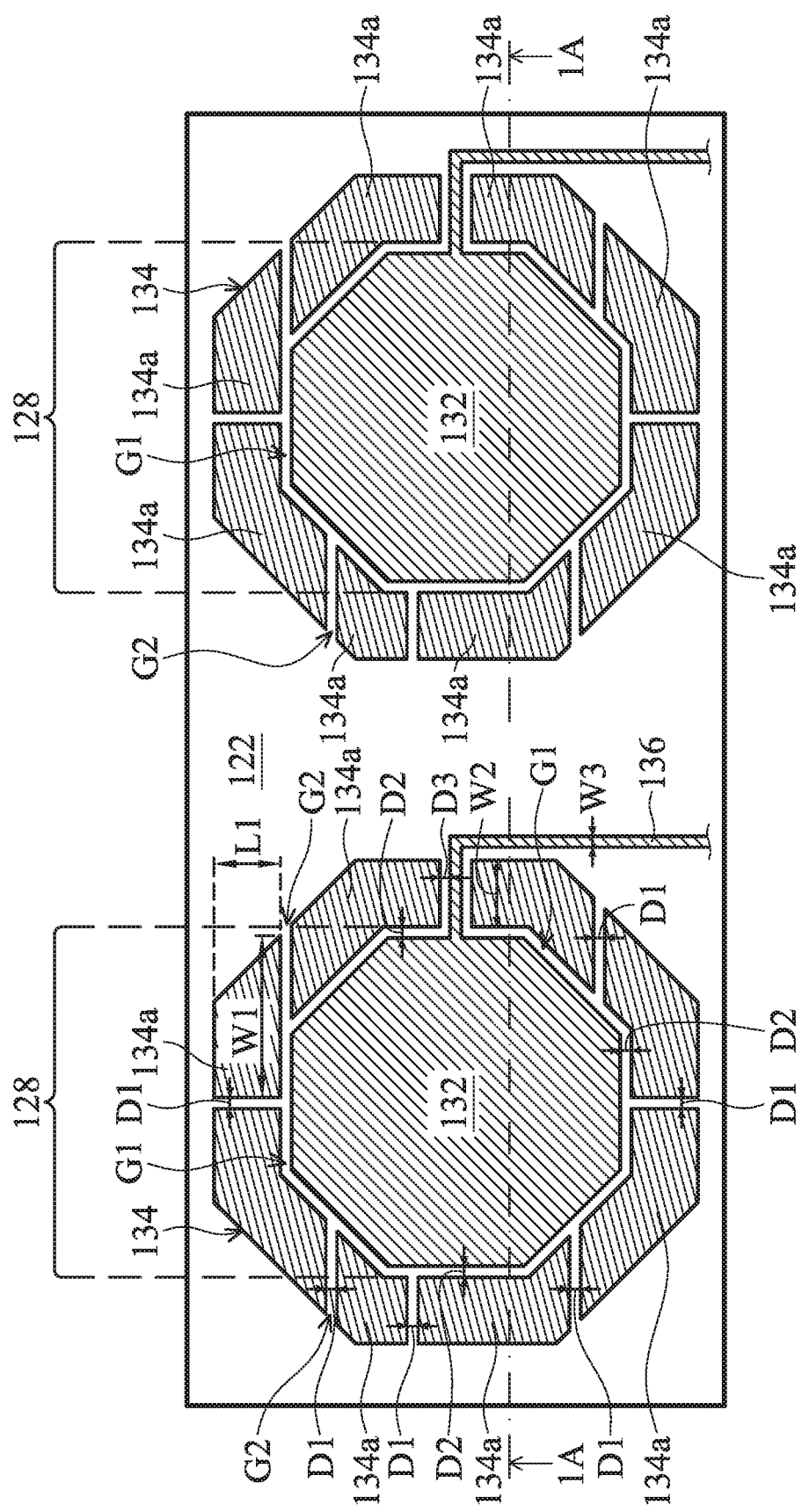
Figure 1B:
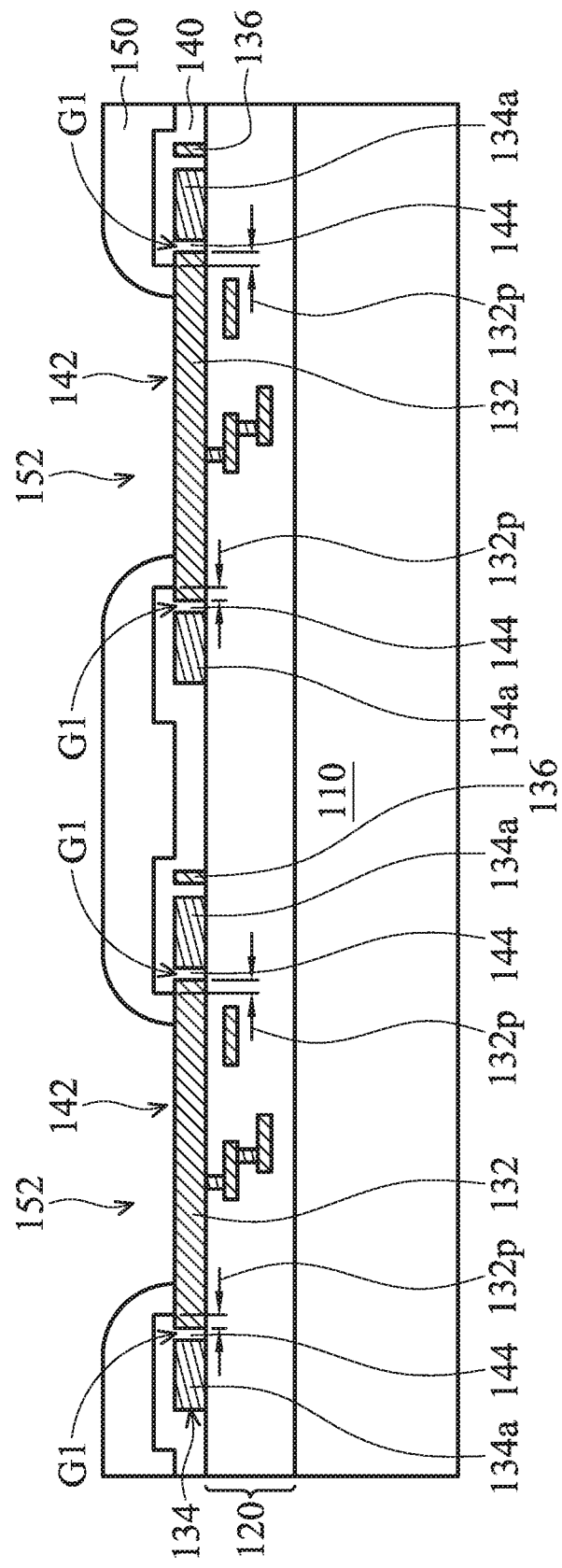
Figures 1, 1B:
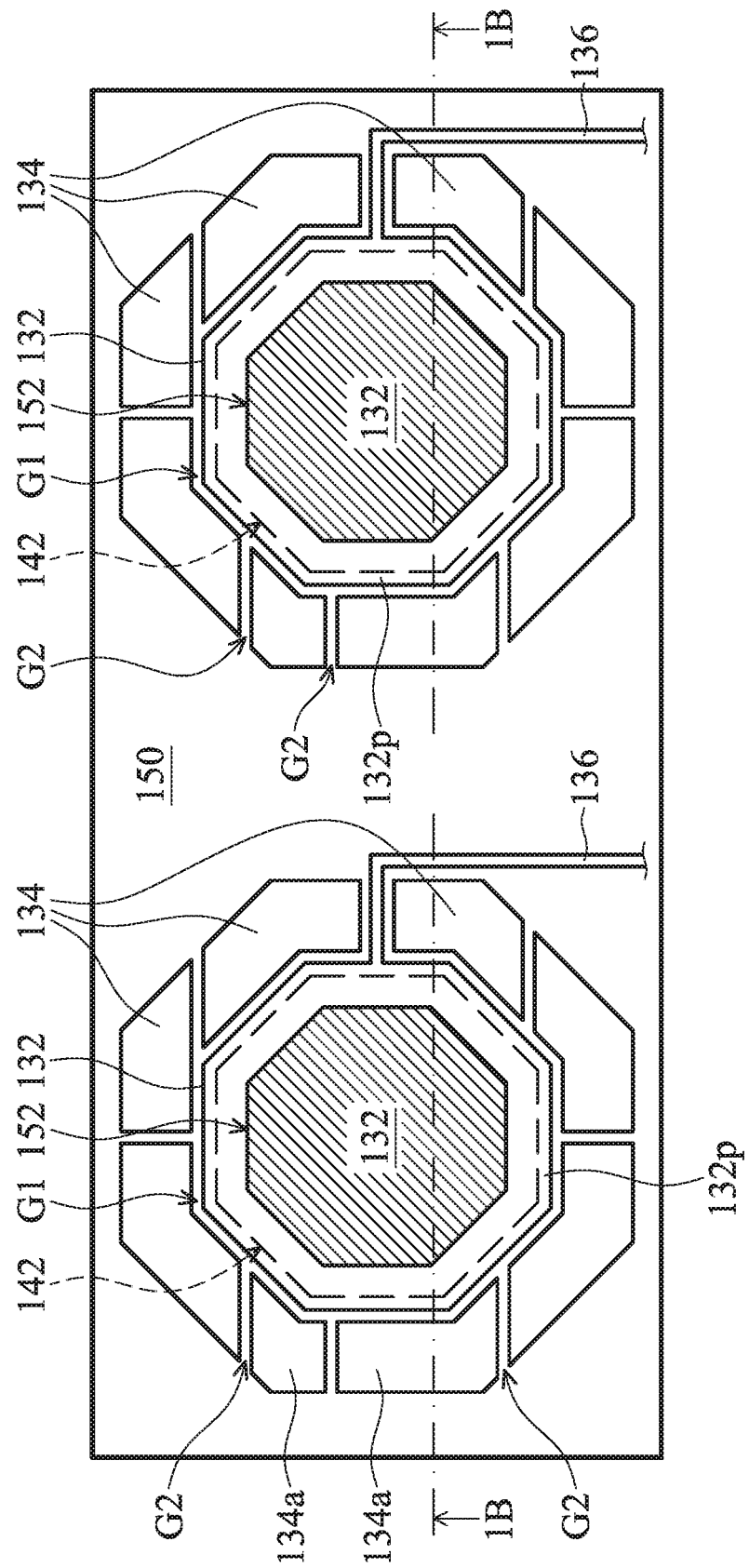
Figure 1C:
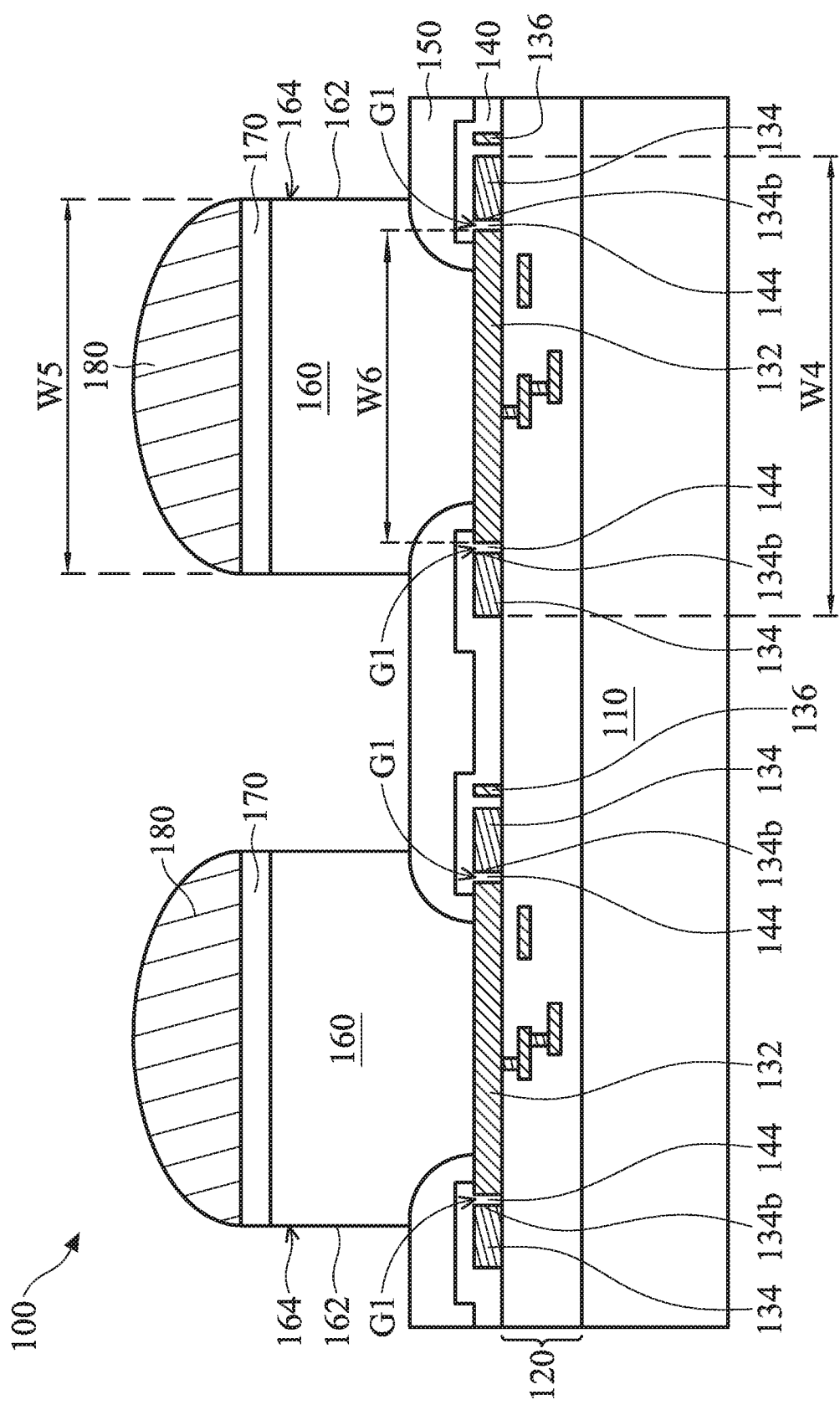
Figures 1, 1C:
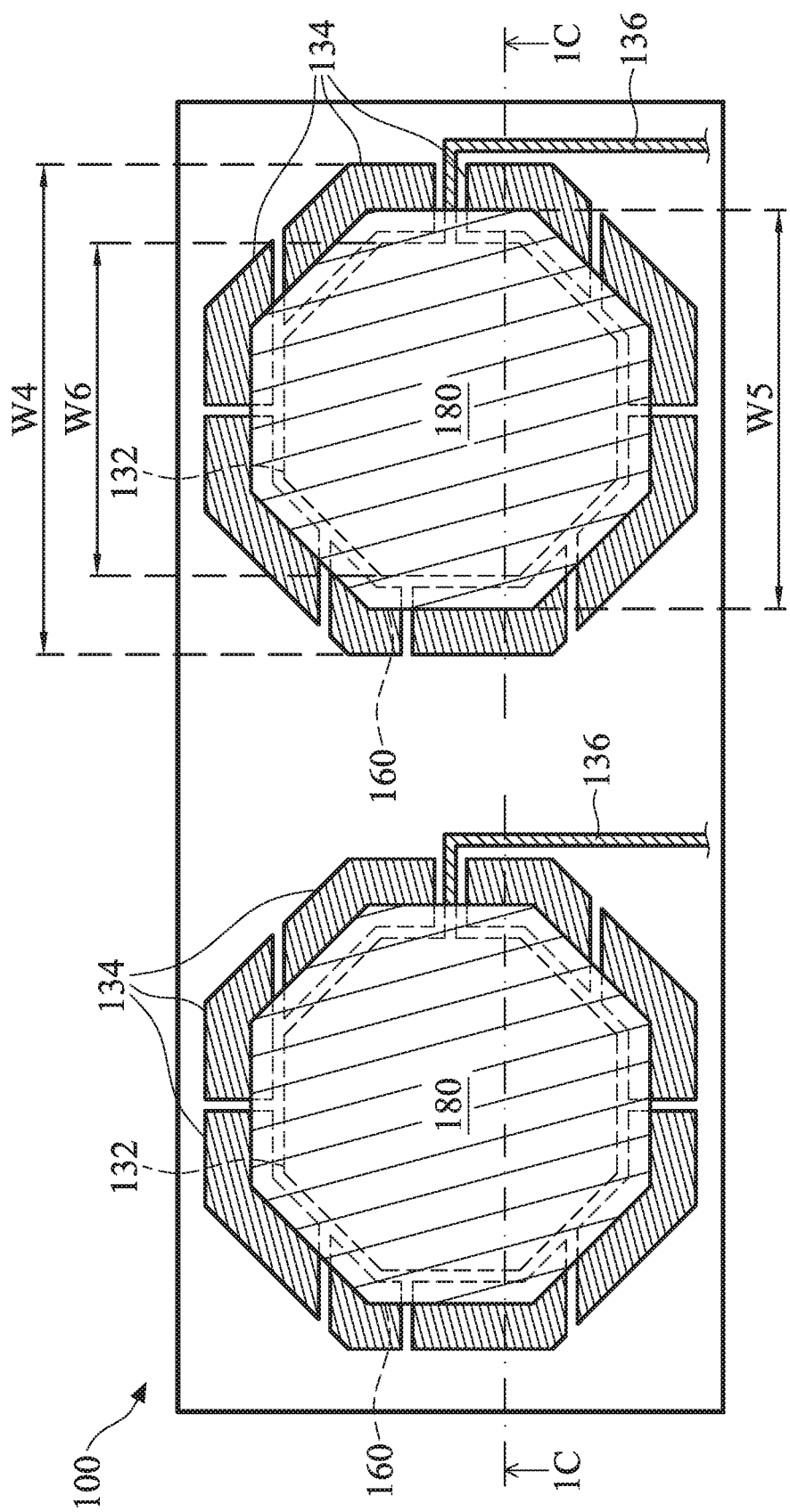

FIGS. 1A-1C are cross-sectional views of various stages of a process for forming a chip structure, in accordance with some embodiments. FIG. 1A-1 is a top view of the chip structure of FIG. 1A, in accordance with some embodiments. FIG. 1A is a cross-sectional view illustrating the chip structure along a sectional line 1A-1A in FIG. 1A-1, in accordance with some embodiments.

As shown in FIGS. 1A and 1A-1, a substrate 110 is provided, in accordance with some embodiments. The substrate 110 has a surface 112, in accordance with some embodiments. In some embodiments, the substrate 110 is made of an elementary semiconductor material including silicon or germanium in a single crystal, polycrystal, or amorphous structure.

In some other embodiments, the substrate 110 is made of a compound semiconductor (e.g., silicon carbide, gallium arsenide, gallium phosphide, indium phosphide, or indium arsenide), an alloy semiconductor (e.g., SiGe or GaAsP), or a combination thereof. The substrate 110 may also include multi-layer semiconductors, semiconductor on insulator (SOI) (such as silicon on insulator or germanium on insulator), or a combination thereof.

In some embodiments, devices (not shown) are formed over and/or in the substrate 110. The devices include active devices and/or passive devices, in accordance with some embodiments. The active devices may include transistors formed at the surface 112. The passive devices are formed in or over the substrate 110, in accordance with some embodiments. The passive devices include resistors, capacitors, or other suitable passive devices.

The redistribution layer 120 is formed over the substrate 110 and the devices, in accordance with some embodiments. In some embodiments, bonding pads 132, shielding pads 134, and conductive lines 136 are formed over the redistribution layer 120. The redistribution layer 120 includes a dielectric layer 122, wiring layers 124, and conductive vias 126, in accordance with some embodiments. The dielectric layer 122 is formed over the surface 112, in accordance with some embodiments. The wiring layers 124 are formed in the dielectric layer 122, in accordance with some embodiments.

As shown in FIG. 1A, the conductive vias 126 are electrically connected between different wiring layers 124, between the wiring layer 124 and the bonding pads 132, and between the wiring layer 124 and the devices, in accordance with some embodiments. The devices are electrically connected to the bonding pads 132 through the wiring layers 124 and the conductive vias 126, in accordance with some embodiments.

The dielectric layer 122 is made of an oxide-containing material (e.g. silicon oxide) or another suitable insulating material, in accordance with some embodiments. The wiring layers 124 and the conductive vias 126 are made of conductive materials such as metal (e.g., aluminum, copper or tungsten) or alloys thereof, in accordance with some embodiments.

In some embodiments, the bonding pads 132, the shielding pads 134, and the conductive lines 136 are formed from a same conductive layer 130. The formation of the bonding pads 132, the shielding pads 134, and the conductive lines 136 includes: forming a conductive layer 130 over the redistribution layer 120; and performing a photolithography process and an etching process over the conductive layer 130 to partially remove the conductive layer 130, in accordance with some embodiments.

The bonding pads 132, the shielding pads 134, and the conductive lines 136 are made of conductive materials such as metal (e.g., aluminum, copper or tungsten) or alloys thereof, in accordance with some embodiments. In some embodiments, the bonding pads 132, the shielding pads 134, and the conductive lines 136 are made of a same material. In some other embodiments, the bonding pads 132 and the shielding pads 134 are made of different materials.

The bonding pads 132, the shielding pads 134, and the conductive lines 136 have a substantially same thickness, in accordance with some embodiments. That is, a thickness T1 of the bonding pad 132 is substantially equal to a thickness T2 of the shielding pad 134, in accordance with some embodiments. The term "substantially equal to" means the difference between the thicknesses T1 and T2 is within 1% of the average between the thicknesses T1 and T2, in accordance with some embodiments. The difference may be due to manufacturing processes.

The thickness T2 of the shielding pad 134 is substantially equal to a thickness T3 of the conductive lines 136, in accordance with some embodiments. The term "substantially equal to" means the difference between the thicknesses T2 and T3 is within 1% of the average between the thicknesses T2 and T3, in accordance with some embodiments. The difference may be due to manufacturing processes.

Each shielding pad 134 surrounds the corresponding bonding pad 132, in accordance with some embodiments. Each shielding pad 134 is spaced apart from the corresponding bonding pad 132 by a gap G1, in accordance with some embodiments. The shielding pad 134 surrounds a region 128 of the redistribution layer 120, in accordance with some embodiments.

The shielding pad 134, the region 128, and the bonding pads 132 have a substantially same shape such as a polygonal shape (e.g., an octagonal shape), a round shape, or an oval shape, in accordance with some embodiments. In some other embodiments, the region 128 and the bonding pads 132 have different shapes.

The shielding pad 134 has portions 134a spaced apart from each other by gaps G2, in accordance with some embodiments. The portions 134a are also referred to as strip portions, in accordance with some embodiments. The portions 134a together surround the corresponding bonding pad 132, in accordance with some embodiments. The portions 134a are spaced apart from each other by a substantially same distance D1, in accordance with some embodiments.

The distance D1 ranges from about 1 μm to about 10 μm, in accordance with some embodiments. The distance D1 ranges from about 2.25 μm to about 5 μm, in accordance with some embodiments. In some other embodiments, the portions 134a are spaced apart from each other by different distances.

In some embodiments, a maximum width W1 of the portion 134a ranges from about 1 μm to about 100 μm, in accordance with some embodiments. The maximum width W1 ranges from about 1.5 μm to about 70 μm, in accordance with some embodiments. The maximum width W1 ranges from about 5 μm to about 70 μm, in accordance with some embodiments.

In some embodiments, a maximum length L1 of the portion 134a ranges from about 1 μm to about 100 μm, in accordance with some embodiments. The maximum length L1 ranges from about 1.5 μm to about 70 μm, in accordance with some embodiments. The maximum length L1 ranges from about 5 μm to about 70 μm, in accordance with some embodiments. The portion 134a is wider than the gap G1, in accordance with some embodiments.

The portions 134a are spaced apart from the corresponding bonding pad 132 by a substantially same distance D2, in accordance with some embodiments. The distance D2 ranges from about 1 μm to about 10 μm, in accordance with some embodiments. The distance D2 ranges from about 2.25 μm to about 5 μm, in accordance with some embodiments. In some other embodiments, the portions 134a are spaced apart from the corresponding bonding pad 132 by different distance. The portions 134a are spaced apart from the corresponding bonding pad 132 by the gap G1, in accordance with some embodiments.

The conductive lines 136 are connected to the bonding pads 132, in accordance with some embodiments. The shielding pads 134 are spaced apart from the conductive lines 136, in accordance with some embodiments. The shielding pads 134 are spaced apart from the conductive lines 136, in accordance with some embodiments. The shielding pads 134 are spaced apart from the conductive lines 136 by a distance D3, in accordance with some embodiments.

The distance D3 ranges from about 1 μm to about 10 μm, in accordance with some embodiments. The distance D3 ranges from about 2.25 μm to about 5 μm, in accordance with some embodiments. In some embodiments, a minimum width W2 of the portion 134a of the shielding pad 134 is greater than a line width W3 of the conductive line 136. In some embodiments, the portions 134a are strip portions with a substantially same line width (e.g., the minimum width W2).

FIG. 1B-1 is a top view of the chip structure of FIG. 1B, in accordance with some embodiments. FIG. 1B is a cross-sectional view illustrating the chip structure along a sectional line 1B-1B in FIG. 1B-1, in accordance with some embodiments. For the sake of clarity, FIG. 1B-1 shows the bonding pads 132, the shielding pads 134, and the conductive lines 136 by solid lines.

As shown in FIGS. 1B and 1B-1, an insulating layer 140 is formed over the redistribution layer 120, the shielding pads 134, and the conductive lines 136, in accordance with some embodiments. The insulating layer 140 is further formed over peripheral portions 132p of the bonding pads 132, in accordance with some embodiments.

The insulating layer 140 has openings 142 exposing central portions of the bonding pads 132 thereunder, in accordance with some embodiments. In some embodiments, portions 144 of the insulating layer 140 are filled into the gaps G1 between the bonding pads 132 and the shielding pads 134 to separate and electrically insulate the bonding pads 132 from the shielding pads 134, in accordance with some embodiments. The portions 144 surround the bonding pads 132, in accordance with some embodiments. The portion 134a of the shielding pad 134 is wider than the portion 144 of the insulating layer 140, in accordance with some embodiments.

In some embodiments, the insulating layer 140 are further filled into the gaps G2 between the portions 134a of the shielding pad 134 to separate and electrically insulate the portion 134a from each other, in accordance with some embodiments. The insulating layer 140 between the portions 134a is used to buffer the stress concentrated on the shielding pad 134, in accordance with some embodiments. The insulating layer 140 is made of a dielectric material, such as undoped silicate glass (USG), silicon nitride, silicon oxide, or silicon oxynitride, in accordance with some embodiments. The insulating layer 140 is formed using a deposition process (e.g., a chemical vapor deposition process or a physical vapor deposition process) and an etching process, in accordance with some embodiments.

As shown in FIGS. 1B and 1B-1, a buffer layer 150 is formed over the insulating layer 140, in accordance with some embodiments. The buffer layer 150 is further formed over the edge portions of the bonding pads 132, in accordance with some embodiments.

The buffer layer 150 has openings 152 exposing central portions of the bonding pads 132, in accordance with some embodiments. The buffer layer 150 is used to buffer the bonding stress from bumps subsequently formed over the bonding pads 132 during subsequent bonding processes, in accordance with some embodiments.

The buffer layer 150 is made of a material softer than the insulating layer 140 and/or the bonding pads 132, in accordance with some embodiments. The buffer layer 150 is made of a polymer material such as epoxy, polyimide, benzocyclobutene (BCB), polybenzoxazole (PBO), or another suitable material, in accordance with some embodiments.

FIG. 1C-1 is a top view of the chip structure of FIG. 1C, in accordance with some embodiments. FIG. 1C is a cross-sectional view illustrating the chip structure along a sectional line 1C-1C in FIG. 1C-1, in accordance with some embodiments. For the sake of simplicity, the insulating layer 140 and the buffer layer 150 are omitted in FIG. 1C-1.

As shown in FIGS. 1C and 1C-1, bumps 160 are formed over the bonding pads 132, in accordance with some embodiments. In some embodiments, an edge portion 162 of the bump 160 is over the insulating layer 140 and the buffer layer 150 adjacent to the bonding pad 132. In some embodiments, a thickness of the buffer layer 150 increases gradually in a direction away from a center of the bump 160.

The edge portion 162 is right over the shielding pad 134, in accordance with some embodiments. The edge portion 162 is right over an edge portion 134b of the shielding pad 134, in accordance with some embodiments. The edge portion 134b surrounds the bonding pad 132, in accordance with some embodiments. In some embodiments, a sidewall 164 of the bump 160 is right over the shielding pad 134. The bump 160 covers the portions 144 of the insulating layer 140, in accordance with some embodiments.

The shielding pad 134 is able to buffer bonding stress from the bump 160 during subsequent bonding processes to prevent the redistribution layer 120 under the bonding pad 132 from damage induced by the bonding stress, in accordance with some embodiments. Therefore, the shielding pad 134 improves the yield of the subsequent bonding processes, in accordance with some embodiments.

In some embodiments, a width W4 of the shielding pad 134 is greater than a width W5 of the bump 160. The width W5 is greater than a width W6 of the bonding pad 132, in accordance with some embodiments. In some embodiments, a ratio of the width W4 to the width W5 ranges from about 1.05 to about 1.3.

If the ratio of the width W4 to the width W5 is less than 1.05, the stress buffer effect of the shielding pad 134 is unobvious, in accordance with some embodiments. If the ratio of the width W4 to the width W5 is greater than 1.3, the stress buffer effect of the shielding pad 134 maintains a substantially same level, in accordance with some embodiments.

The insulating layer 140 is partially between the bump 160 and the shielding pad 134, in accordance with some embodiments. The buffer layer 150 is partially between the bump 160 and the shielding pad 134, in accordance with some embodiments. As shown in FIG. 1C-1, the shielding pad 134, the bonding pads 132, and the bumps 160 have a substantially same shape such as a polygonal shape (e.g., an octagonal shape), a round shape, or an oval shape, in accordance with some embodiments. The bumps 160 are made of any suitable conductive material, including Cu, Ni, Pt, Al, combinations thereof, or the like, in accordance with some embodiments.

The bumps 160 may be formed through any number of suitable techniques, including a chemical vapor deposition process, a physical vapor deposition process, an electro-chemical deposition (ECD) process, a molecular beam epitaxy (MBE) process, an atomic layer deposition (ALD) process, an electroplating process, or the like.

As shown in FIGS. 1C and 1C-1, a cap layer 170 is formed over the bumps 160, in accordance with some embodiments. The cap layer 170 is used to be a barrier layer to prevent copper in the bumps 160 from diffusing into a solder layer subsequently formed thereon so as to increases the reliability and bonding strength of the solder layer. The cap layer 170 may include nickel, tin, tin-lead (SnPb), gold (Au), silver, palladium (Pd), In, nickel-palladium-gold (NiPdAu), nickel-gold (NiAu), other similar materials, or alloy.

As shown in FIGS. 1C and 1C-1, a solder layer 180 is formed over the cap layer 170, in accordance with some embodiments. The solder layer 180 is made of a conductive material such as tin, lead, silver, copper, nickel, bismuth, combinations thereof, alloys thereof, in accordance with some embodiments. In this step, a chip structure 100 is substantially formed, in accordance with some embodiments.

Figure 2:
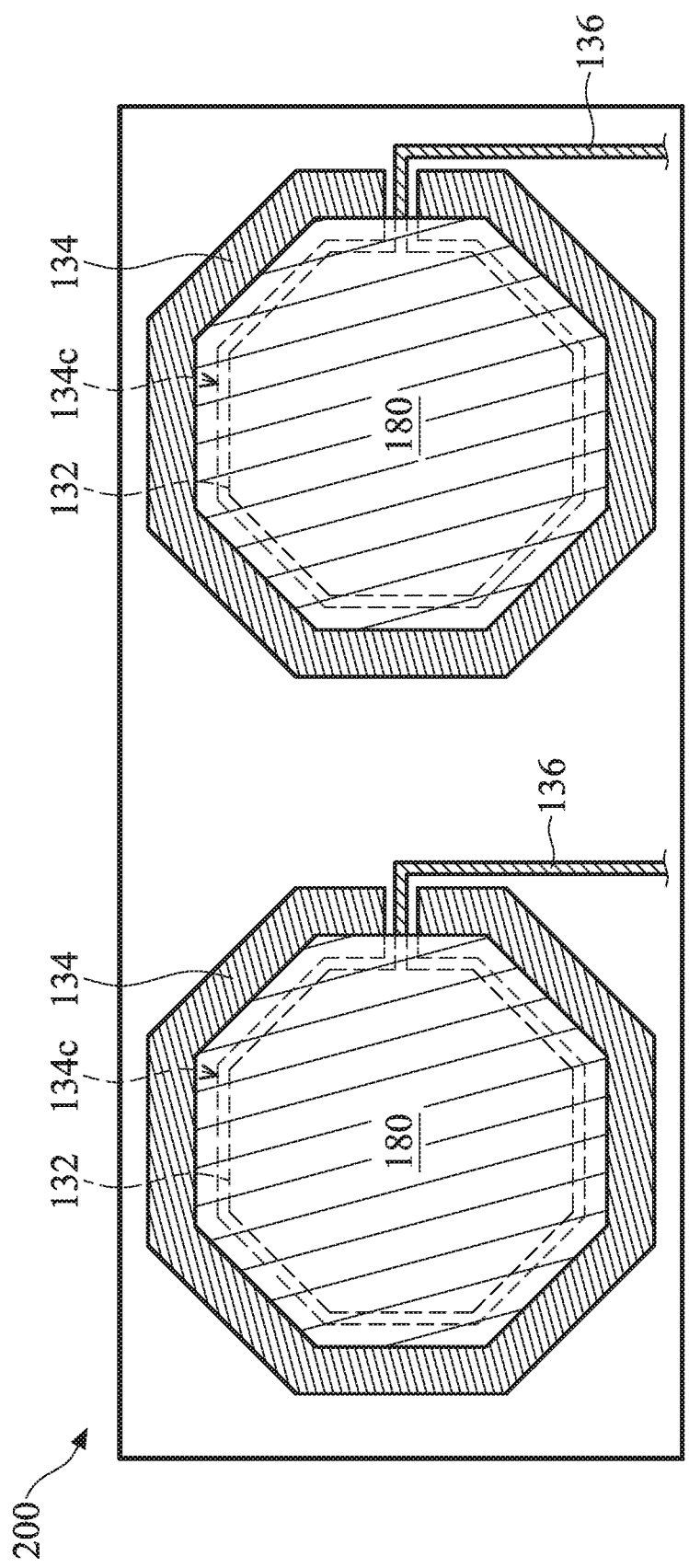
FIG. 2 is a top view of a chip structure 200, in accordance with some embodiments.

FIG. 2 is a top view of a chip structure 200, in accordance with some embodiments. As shown in FIG. 2, the chip structure 200 is similar to the chip structure 100 of FIG. 1C, except that each shielding pad 134 of the chip structure 200 is a continuous structure, in accordance with some embodiments.

The shielding pad 134 has a ring shape (or a C-shape), in accordance with some embodiments. The shielding pad 134 has an opening 134c, in accordance with some embodiments. The bonding pad 132 is in the opening 134c, in accordance with some embodiments. The opening 134c and the bonding pad 132 have a same shape such as a polygonal shape (e.g., an octagonal shape), a round shape, or an oval shape, in accordance with some embodiments.

Figure 3:
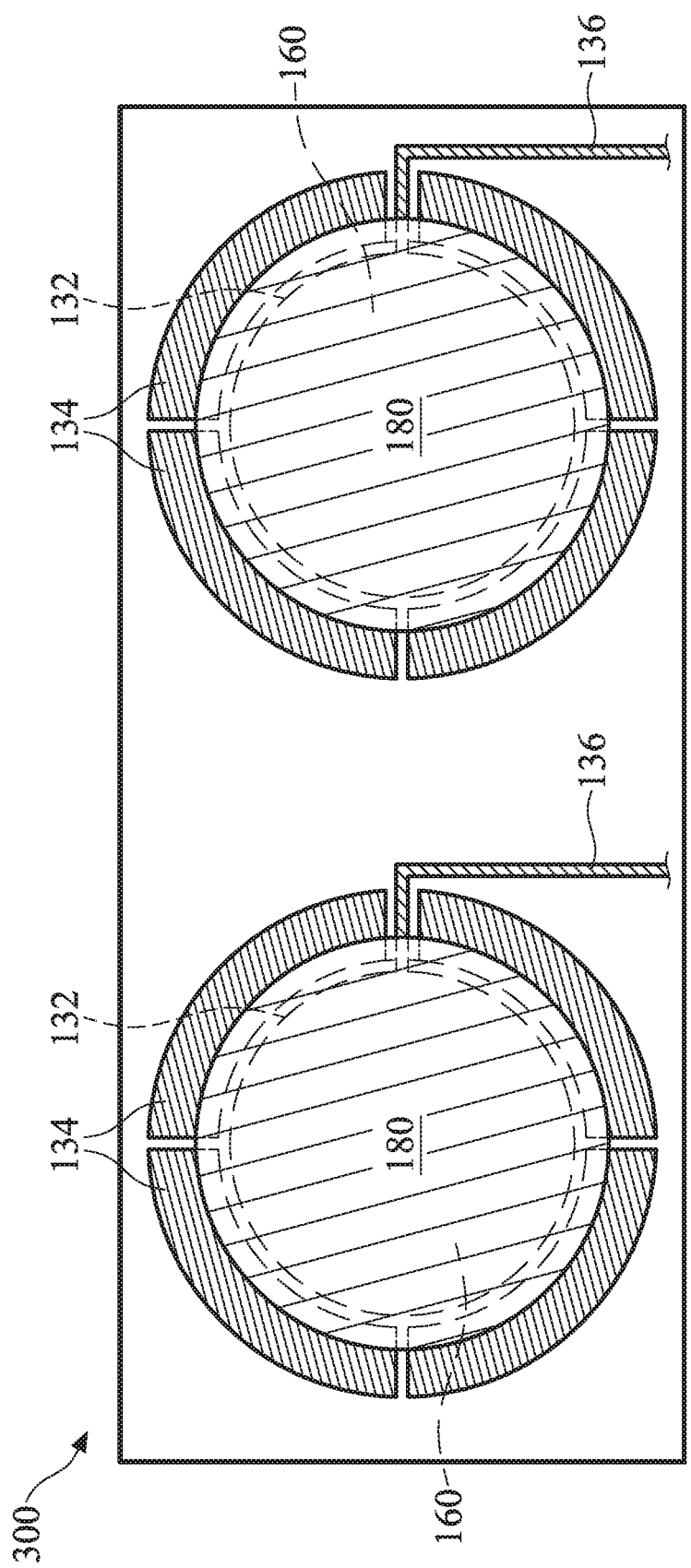
FIG. 3 is a top view of a chip structure 300, in accordance with some embodiments.

FIG. 3 is a top view of a chip structure 300, in accordance with some embodiments. As shown in FIG. 3, the chip structure 300 is similar to the chip structure 100 of FIG. 1C-1, except that the shielding pads 134, the bumps 160, and the solder layer 180 of the chip structure 300 have a round shape, in accordance with some embodiments.

Figure 4:
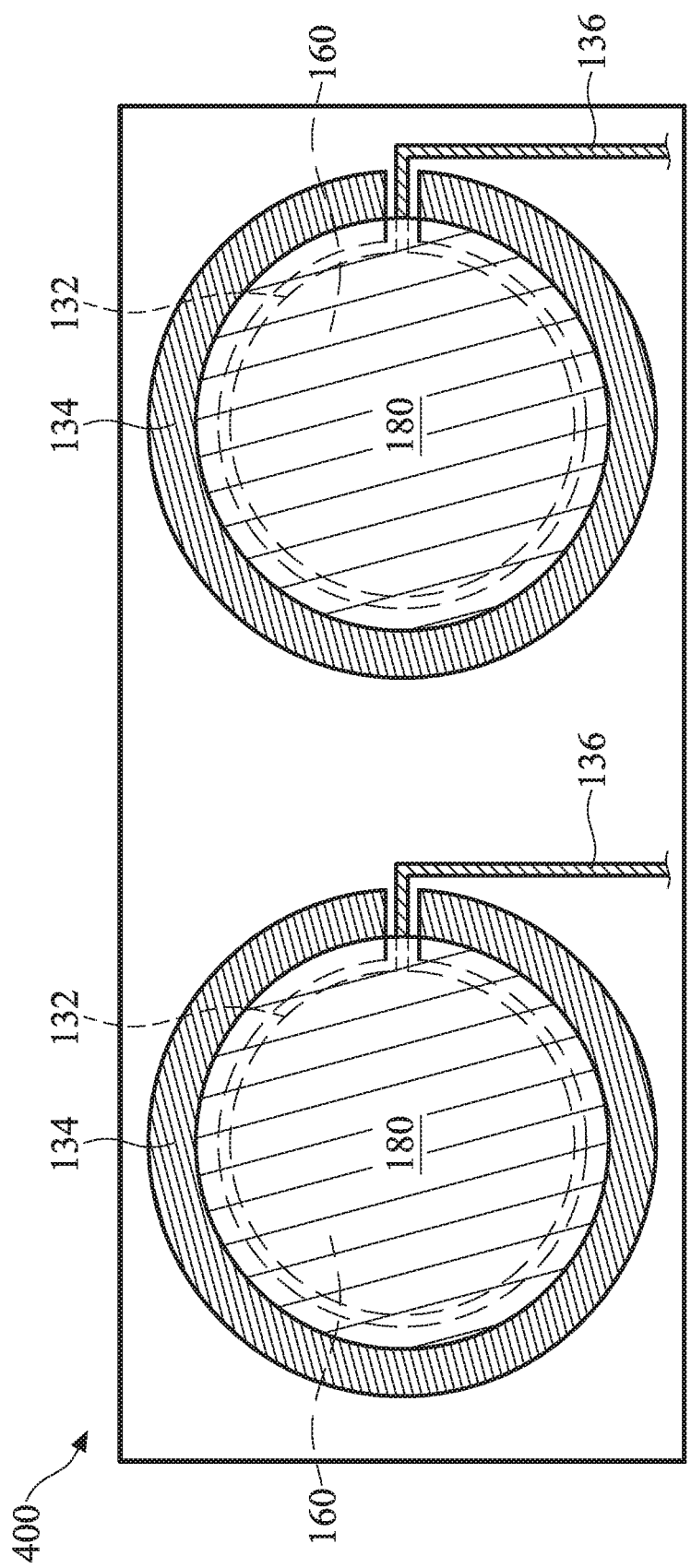
FIG. 4 is a top view of a chip structure 400, in accordance with some embodiments.

FIG. 4 is a top view of a chip structure 400, in accordance with some embodiments. As shown in FIG. 4, the chip structure 400 is similar to the chip structure 200 of FIG. 2, except that the shielding pads 134, the bumps 160, and the solder layer 180 of the chip structure 400 have a round shape, in accordance with some embodiments.

Figure 5A:
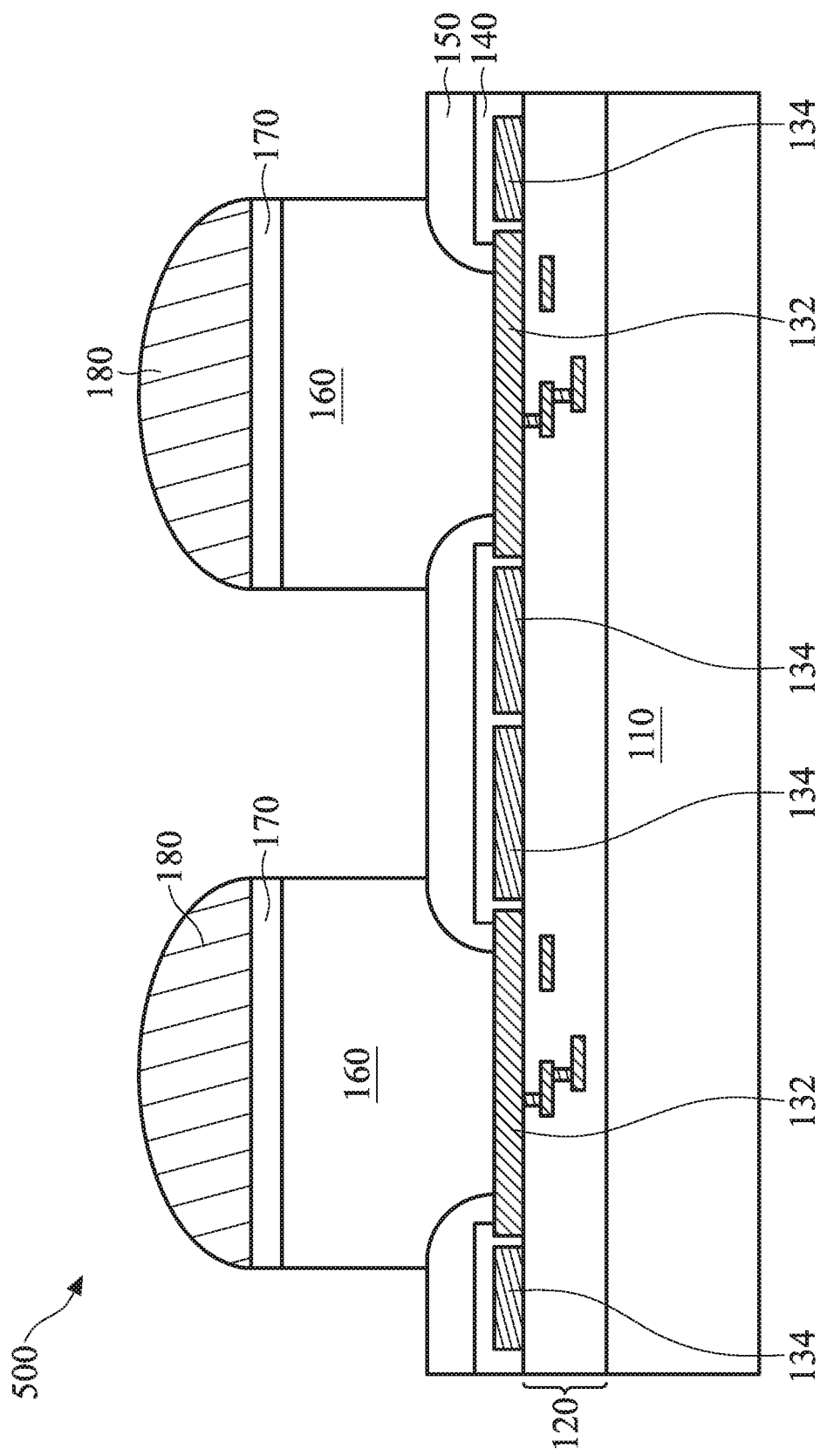
FIG. 5A is a cross-sectional view of a chip structure 500, in accordance with some embodiments.
Figure 5B:
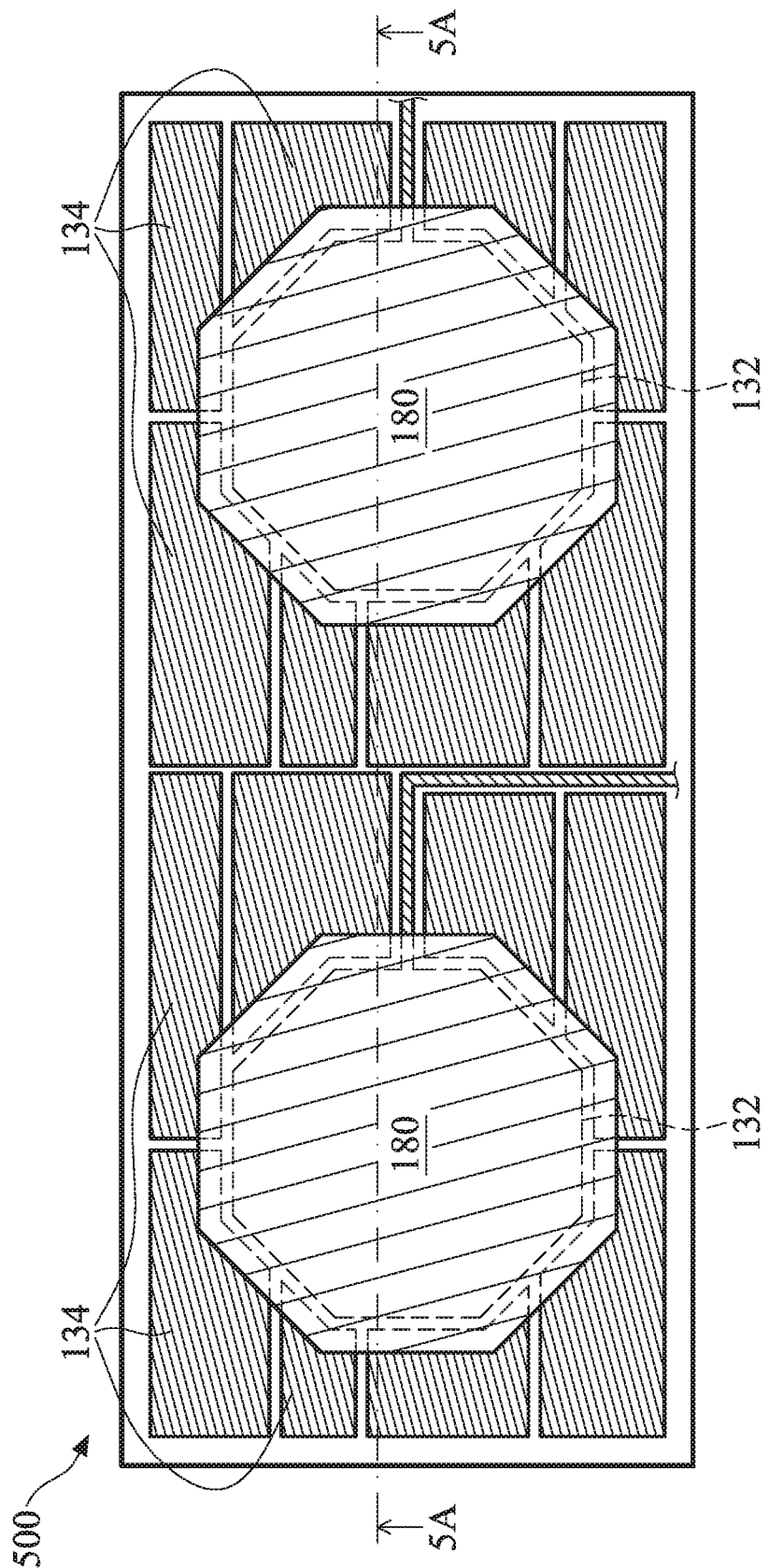
FIG. 5B is a top view of the chip structure 500 of FIG. 5A, in accordance with some embodiments.

FIG. 5A is a cross-sectional view of a chip structure 500, in accordance with some embodiments. FIG. 5B is a top view of the chip structure 500 of FIG. 5A, in accordance with some embodiments. FIG. 5A is a cross-sectional view illustrating the chip structure along a sectional line 5A-5A in FIG. 5B, in accordance with some embodiments.

As shown in FIGS. 5A and 5B, the chip structure 500 is similar to the chip structure 100 of FIG. 1C, except that the shielding pads 134 surrounding different bonding pads 132 are close to each other, in accordance with some embodiments.

Figure 6:
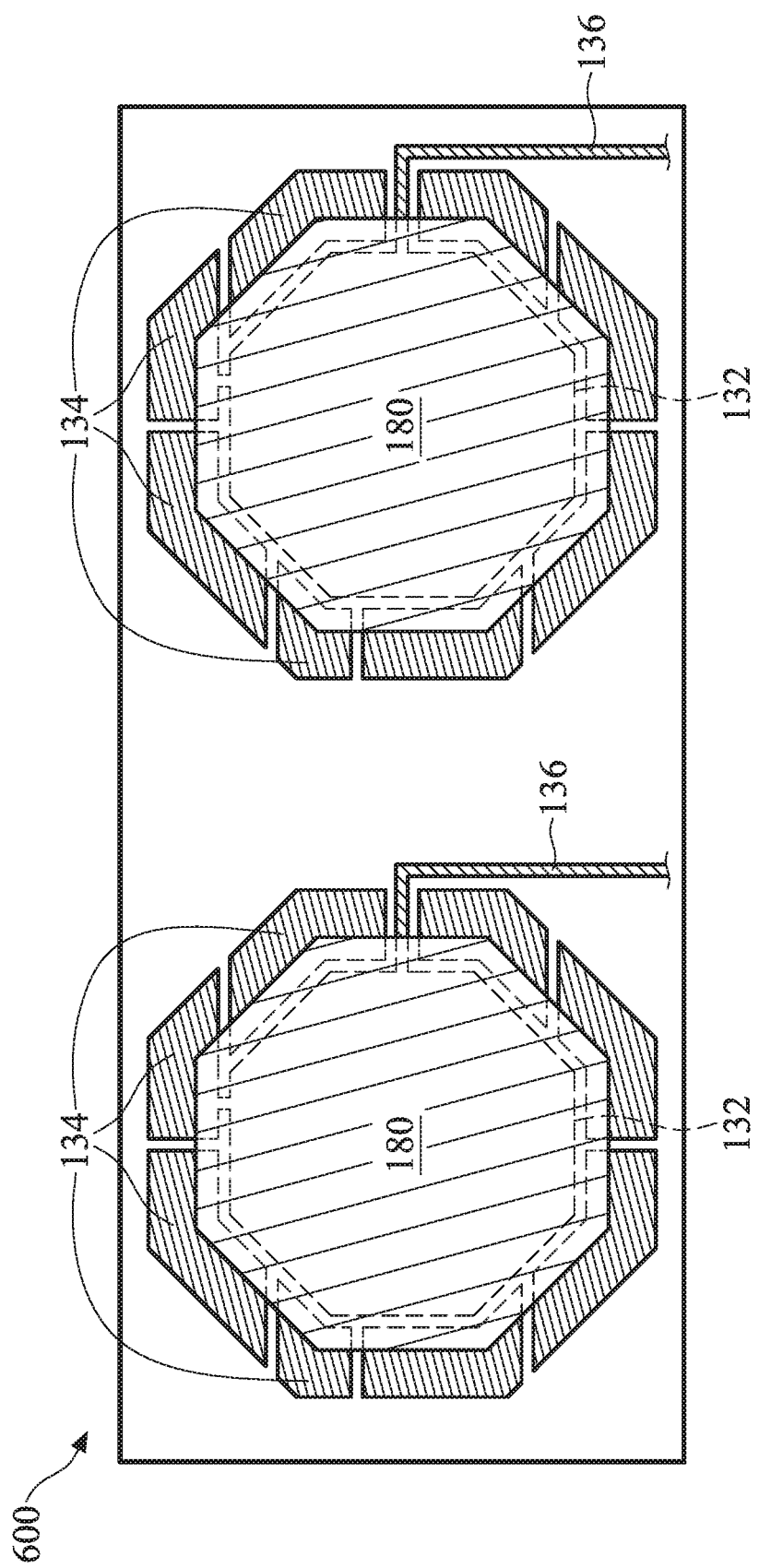
FIG. 6 is a top view of a chip structure 600, in accordance with some embodiments.

FIG. 6 is a top view of a chip structure 600, in accordance with some embodiments. As shown in FIG. 6, the chip structure 600 is similar to the chip structure 100 of FIG. 1C-1, except that the shielding pad 134 is electrical connected to the corresponding bonding pad 132, in accordance with some embodiments.

Processes and materials for forming the chip structures 200, 300, 400, 500 and 600 may be similar to, or the same as, those for forming the chip structure 100 described above.

In accordance with some embodiments, chip structures and methods for forming the chip structures are provided. The chip structure has a shielding pad surrounding a bonding pad. The shielding pad is partially under a bump over the bonding pad to buffer bonding stress from the bump during subsequent bonding processes to prevent a redistribution layer under the bonding pad from damage induced by the bonding stress. Therefore, the shielding pad improves the yield of the subsequent bonding processes.

In accordance with some embodiments, a chip structure is provided. The chip structure includes a substrate. The chip structure includes a redistribution layer over the substrate. The chip structure includes a bonding pad over the redistribution layer. The chip structure includes a shielding pad over the redistribution layer and surrounding the bonding pad. The chip structure includes an insulating layer over the redistribution layer and the shielding pad. The chip structure includes a bump over the bonding pad and the insulating layer. A sidewall of the bump is over the shielding pad.

In accordance with some embodiments, a chip structure is provided. The chip structure includes a substrate. The chip structure includes a dielectric layer over the substrate. The chip structure includes a bonding pad over the dielectric layer. The chip structure includes a shielding pad over the dielectric layer. The shielding pad has a plurality of strip portions spaced apart from each other, the strip portions surround the bonding pad, and the strip portions are spaced apart from the bonding pad by a substantially same distance. The chip structure includes an insulating layer over the dielectric layer and the shielding pad. The chip structure includes a bump over the bonding pad and the insulating layer adjacent to the bonding pad. The bump partially overlaps each strip portion.

In accordance with some embodiments, a method for forming a chip structure is provided. The method includes forming a redistribution layer over a substrate. The method includes forming a conductive layer over the redistribution layer. The conductive layer includes a bonding pad and a shielding pad surrounding the bonding pad, and the bonding pad is spaced apart from the shielding pad by a first gap. The method includes forming an insulating layer over the redistribution layer and the shielding pad. The insulating layer is filled into the first gap. The method includes forming a bump over the bonding pad and the insulating layer over the shielding pad. The bump partially overlaps the shielding pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
    a substrate;
    a dielectric layer over the substrate;
    a bonding pad over the dielectric layer;
    a shielding pad over the dielectric layer, wherein the shielding pad has a plurality of strip portions spaced apart from each other, the strip portions surround the bonding pad, and the strip portions are spaced apart from the bonding pad by a substantially same distance;
    an insulating layer over the dielectric layer and the shielding pad;
    a buffer layer over the insulating layer and in contact with a top surface of the insulating layer, wherein a bottom-most surface of the buffer layer is in contact with a top surface of the bonding pad; and
    a bump over the bonding pad and the insulating layer adjacent to the bonding pad, wherein the bump partially overlaps each strip portion, a thickness of the buffer layer increases gradually in a direction away from a center of the bump, and the buffer layer comprises:
        a first portion directly under the bump;
        a second portion extending from the first portion and laterally protruding outside an edge sidewall of the bump;
        a third portion extending from the second portion; and
        a fourth portion extending from the third portion, wherein a thickness of the third portion is greater than a thickness of the second portion and a thickness of the fourth portion.

2. The chip structure as claimed in claim 1, wherein a bottom surface of the first portion is misaligned with a bottom surface of the second portion, and a top surface of the first portion is continuously connected to a top surface of the second portion.

3. The chip structure as claimed in claim 1, wherein the strip portions have a substantially same first line width.

4. The chip structure as claimed in claim 3, further comprising:
a conductive line over the dielectric layer and connected to the bonding pad, wherein the strip portions are spaced apart from the conductive line, and the first line width is greater than a second line width of the conductive line.

5. A chip structure, comprising:
a substrate;
a redistribution layer disposed over the substrate;
a conductive layer disposed over the redistribution layer, wherein the conductive layer comprises a bonding pad and a shielding pad surrounding the bonding pad, and the bonding pad is spaced apart from the shielding pad by a first gap;
an insulating layer disposed over the redistribution layer and the shielding pad, wherein the insulating layer is filled into the first gap;
a buffer layer disposed over the insulating layer and in contact with a top surface of the insulating layer; and
a bump disposed over the bonding pad and the insulating layer over the shielding pad, wherein the bump partially overlaps the shielding pad, wherein a virtual line extending in a direction that is parallel to a surface of the substrate sequentially passes through the buffer layer, the insulating layer, the buffer layer, and the bump, a thickness of the buffer layer increases gradually in a direction away from a center of the bump, wherein the buffer layer comprises:
a first portion directly under the bump;
a second portion laterally extending from the first portion and protruding outside an edge sidewall of the bump; and
a third portion directly under the second portion and laterally sandwiched by two portions of the insulating layer.

6. The chip structure as claimed in claim 5, wherein the insulating layer covers the entire shielding pad and a peripheral portion of the bonding pad.

7. The chip structure as claimed in claim 5, wherein the shielding pad has a plurality of portions spaced apart from each other by second gaps, and the insulating layer is filled into the second gaps.

8. The chip structure as claimed in claim 5, wherein a width of the second portion is greater than a width of the third portion.

9. The chip structure as claimed in claim 5, wherein sidewalls of the second portion are misaligned with sidewalls of the third portion.

10. A chip structure, comprising:
a substrate;
a redistribution layer over the substrate;
a bonding pad over the redistribution layer;
a shielding pad over the redistribution layer and surrounding the bonding pad;
an insulating layer over the redistribution layer and the shielding pad;
a buffer layer over a top surface of the insulating layer; and
a bump over the bonding pad and the insulating layer, wherein a sidewall of the bump is over the shielding pad, wherein a bottom surface of the bump is lower than a top surface of the insulating layer, and
wherein the buffer layer comprises:
a first portion directly under the bump;
a second portion laterally extending from the first portion and protruding outside an edge sidewall of the bump; and
a third portion directly extending from the second portion and laterally sandwiched by two parts of the insulating layer;
a fourth portion extending from the third portion, wherein a thickness of the third portion is greater than a thickness of the second portion and a thickness of the fourth portion.

11. The chip structure as claimed in claim 10, further comprising:
a conductive line over the redistribution layer and connected to the bonding pad, wherein the shielding pad is spaced apart from the conductive line, and a width of the shielding pad is greater than a line width of the conductive line.

12. The chip structure as claimed in claim 10, wherein the buffer layer is in contact with a top surface of the insulating layer, wherein the first portion of the buffer layer is between the bump and the insulating layer in a direction that is parallel to a surface of the substrate.

13. The chip structure as claimed in claim 10, wherein the second portion is exposed from the bump.

14. The chip structure as claimed in claim 10, wherein a curved interface is formed between the first portion and the bump.

15. The chip structure as claimed in claim 10, wherein a part of the third portion extends in the insulating layer and exposed from the bump.

16. The chip structure as claimed in claim 10, wherein the insulating layer comprises a first part under the second portion and a second part under the third portion, and the first part and the second part have different thicknesses.

17. The chip structure as claimed in claim 10, further comprising a conductive line under the second portion and does not right under the third portion.

18. The chip structure as claimed in claim 10, wherein a portion of the insulating layer is between the bonding pad and the shielding pad.

19. The chip structure as claimed in claim 18, wherein the portion of the insulating layer separates and electrically insulates the bonding pad from the shielding pad.

20. The chip structure as claimed in claim 18, wherein the bump is over the portion of the insulating layer.

* * * * *